US005306960A

United States Patent [19]

Lendaro

[11] Patent Number: 5,306,960

[45] Date of Patent: Apr. 26, 1994

[54] COMMON BIAS CIRCUIT FOR A PLURALITY OF DISCRETE IC'S EACH HAVING THEIR OWN BIAS CIRCUITRY

[75] Inventor: Jeffery B. Lendaro, Noblesville, Ind.

[73] Assignee: Thomson Consumer Electronics, Inc., Indianapolis, Ind.

[21] Appl. No.: 945,847

[22] Filed: Sep. 16, 1992

Related U.S. Application Data

[63] Continuation of Ser. No. 696,562, May 6, 1991, abandoned.

[51] Int. Cl.$^5$ .......... H03K 3/01; H03K 3/26

[52] U.S. Cl. .......... 307/296.1; 307/303; 307/443; 307/296.4

[58] Field of Search .......... 307/296.1, 303, 443, 307/296.4

[56] References Cited

U.S. PATENT DOCUMENTS

| | | | |
|---|---|---|---|
| 4,697,095 | 9/1987 | Fujii | 307/303 |
| 4,990,797 | 2/1991 | Real et al. | 307/303 |

FOREIGN PATENT DOCUMENTS

| | | | |
|---|---|---|---|
| 0241454 | 10/1986 | Japan . | |
| 0095653 | 4/1988 | Japan | 307/296.1 |
| 0103820 | 4/1988 | Japan . | |
| 0154407 | 6/1988 | Japan . | |
| 0276660 | 11/1989 | Japan | 307/296.1 |
| 0003957 | 1/1990 | Japan | 307/296.1 |

OTHER PUBLICATIONS

RCA Solid State Data Book, 1986, pp. 247, 248, 255, 295, 296, 384, 388, 409, 415, 426.

*Primary Examiner*—Margaret R. Wambach
*Attorney, Agent, or Firm*—Joseph S. Tripoli; Peter M. Emanuel; Frederick A. Wein

[57] ABSTRACT

A circuit is presented for operating discrete integrated circuits from a common bias source by DC coupling the individual bias circuits of the discrete IC's together to eliminate signal coupling capacitors otherwise required between the discrete IC's, and to eliminate the individual bias bypass capacitors otherwise required for the discrete IC's.

7 Claims, 2 Drawing Sheets

COMMON BIAS CIRCUIT FOR A PLURALITY OF DISCRETE IC'S EACH HAVING THEIR OWN BIAS CIRCUITRY

This is a continuation division of application Ser. No. 07/696,562, filed May 6, 1991, now abandoned.

BACKGROUND

For an integrated circuit (IC) to be powered from a single voltage power supply, a bias point is established internal or external to the chip. This may be done inside the IC as, for example, in the TA7630 IC manufactured by the Toshiba Company of Japan. In such a case, the bias voltage is available at a pin of the chip for coupling thereto a large filter capacitor since it is not practicable to put large capacitors within the circuit housing. In the alternative, the bias can be established external to the IC by an external resistor divider or zener diode circuits, as with respect to the TA9187 chip also manufactured by the Toshiba Company of Japan. Because of different IC designs, and IC to IC variations and other component tolerances, a tolerance in the magnitude of the bias voltage is to be expected. Because of this tolerance in the bias voltage, coupling capacitors are used to block this DC component from coupling between chips to prevent the difference tolerance voltage from being amplified. It is also necessary to filter each bias supply to eliminate crosstalk or feedback within the chip.

It is a common practice in integrated circuits, including integrated circuits having a bias supply generated internal to the IC, for providing bias to individual amplifier portions disposed within the same IC. In such a case, the bias supply and the individual portions within the chip are designed to operate with each other without signal coupling capacitors. In such a case, precautions are taken in the design of the chip to assure this compatibility within the chip. This is not the case for whole discrete IC's which can be operated along with other chips over which the IC designer has no control over.

Since the IC designer has no control over other external chips the specific IC will be used with, bias compatibility with other chips is not a design consideration. For such a case, the data sheets and applications notes for the IC chips specify that decoupling capacitors be used in the signal path and that there be isolation between bias supplies. This is done to assure that the specific IC chip will function as intended and as specified in the data sheets.

Some examples of IC's which provide an internal bias to individual portions within the same housing are shown in the RCA Integrated Circuits for Linear Applications Databook, copyrighted 1986 by the RCA Corporation, U.S.A. In particular, the block diagram of the CA3060 Operational Transconductance Amplifier Array shows three operational amplifiers with a bias regulator. The circuit for a tri-level comparator circuit shows each of the three operational amplifiers receiving bias from the bias regulator. A similar situation is shown in block diagrams for the CA3401, CA3450, CA3493, and CA5422 integrated circuits, and an applications note for the CA3130, all of which show operational amplifiers on the same chip receiving bias from a common bias network also on the chip and receiving power from the V+ terminal.

The present invention recognizes that if all discrete IC's were to operate with the same bias level, e.g. ½ of the same supply voltage which is coupled to some or all of the chips in a television receiver or the like, it would be possible to couple the bias/filter points together and force all of the IC's to be coupled to the same bias voltage. This would allow the discrete IC's to have the signal leads DC coupled and to eliminate the AC coupling capacitors otherwise required for coupling signal between chips. Additionally, the individual bias bypass capacitors required for each IC would not be required. Accordingly, it is desired to be able to eliminate signal coupling capacitors otherwise required between discrete IC's and to eliminate the individual bias bypass capacitors otherwise required for the discrete IC's.

As used herein, the terms discrete IC's and chips are intended to include monolithic circuits as well as non-monolithic circuits such as hybrid IC's and encapsulated modules.

SUMMARY OF THE INVENTION

Briefly, the present invention is directed to a circuit for operating discrete integrated circuits from a common bias source by DC coupling the individual bias circuits of the discrete IC's together to eliminate signal coupling capacitors otherwise required between the discrete IC's and to eliminate the individual bias bypass capacitors otherwise required for the discrete IC's.

DETAILED DESCRIPTION OF THE PREFERRED EMBODIMENT

Figure 1:
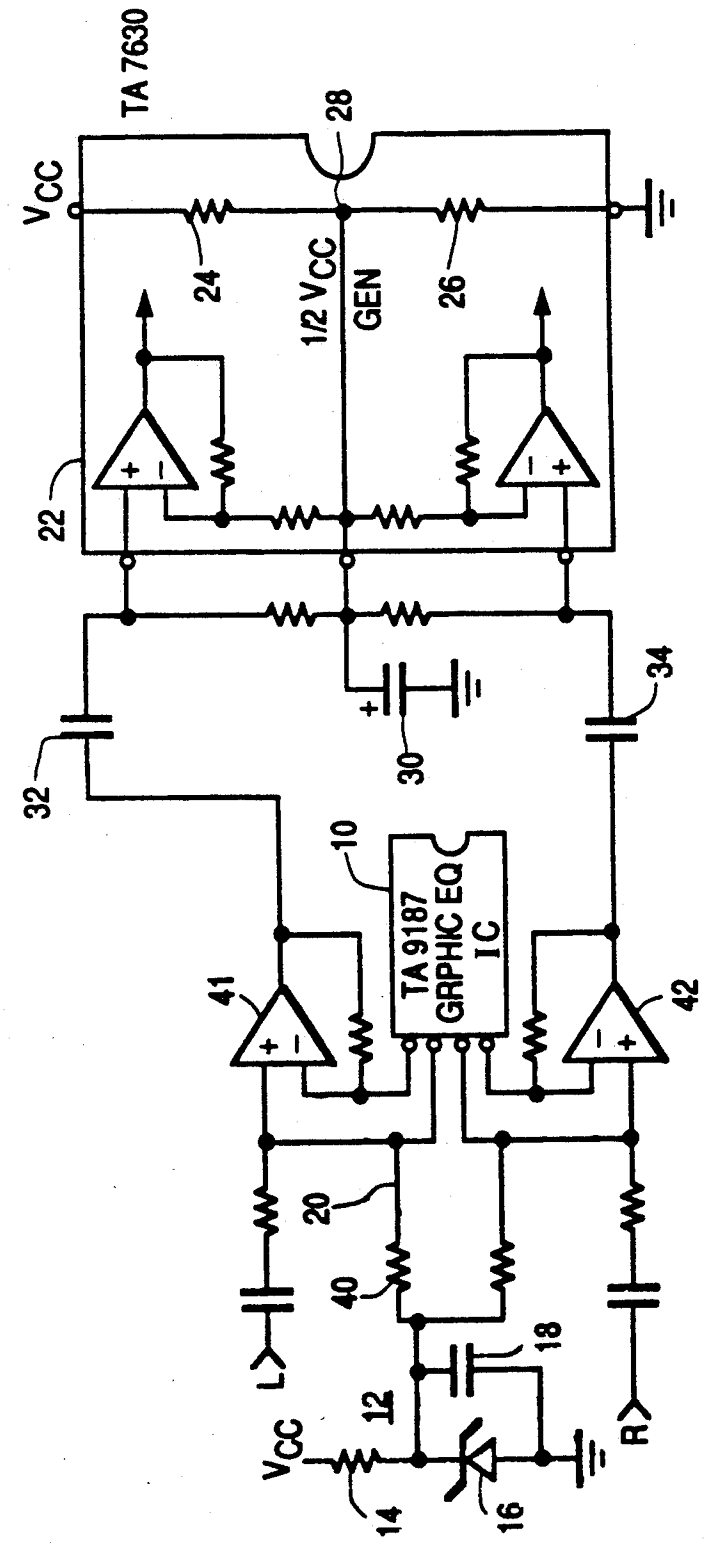
FIG. 1 PRIOR ART
FIG. 1 shows a block diagram of a prior art bias connection for discrete IC's.

Referring now to FIG. 1, there is shown a block diagram of a prior art bias circuit configuration. The bias for integrated circuit 10 is generated by external bias generating circuit 12 comprising a resistor 14 coupled to a zener diode 16 with the series circuit coupled between the positive supply voltage Vcc and ground. A capacitor 18 is coupled across zener diode 16 for filtering the bias voltage generated across zener diode 16 with the bias voltage being provided to IC 10 at line 20. In the exemplary embodiment, the bias is Vcc/2.

IC 22 has its bias generated internally by series resistors 24 and 26 coupled between Vcc and ground with the bias being generated junction 28. Both IC 10 and IC 22 are coupled to power supply voltage Vcc and ground at terminals T and have internal power supply distribution circuits, symbolically shown as P, which may or may not include bias circuitry. For the reasons discussed above, filter capacitor 30 is coupled to the bias node 28 and AC coupling capacitors 32 and 34 are required for coupling the AC signal to chip 22.

Figure 2:
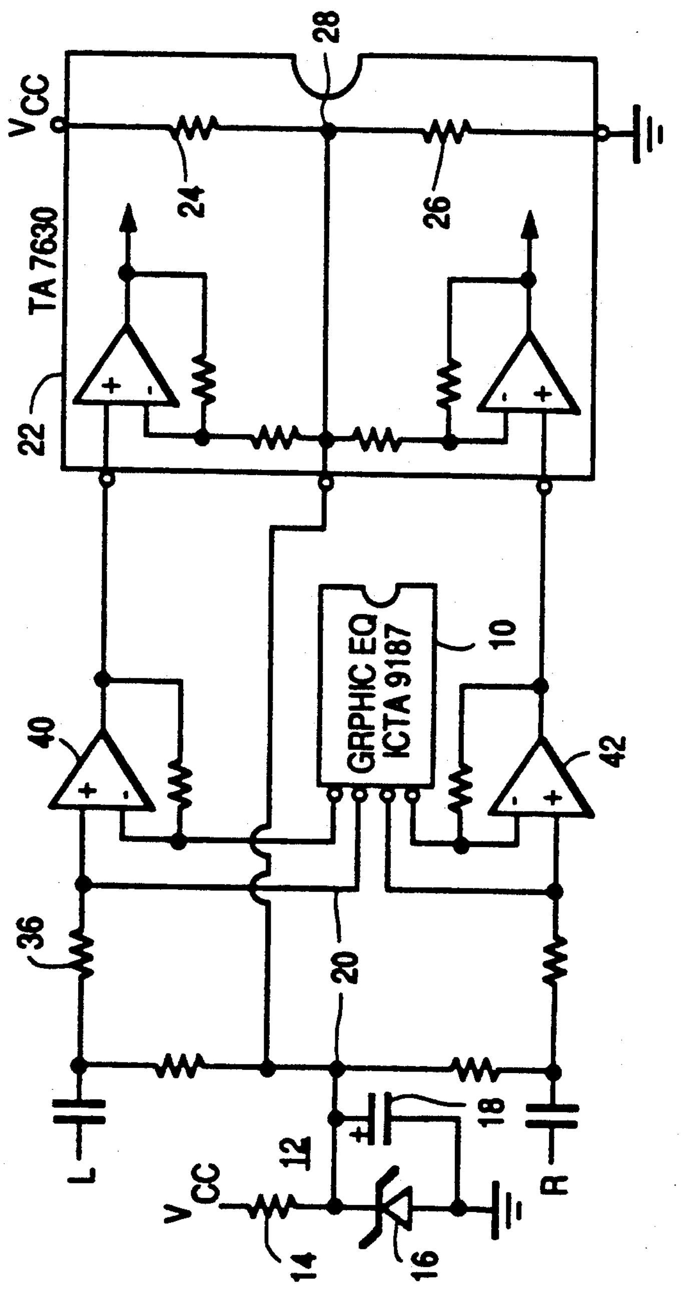
FIG. 2 shows a block diagram of the coupling of bias circuits for discrete IC's according to aspects of the present invention.

Referring now to FIG. 2 wherein members common to FIG. 1 have been designated like numbers, there is shown a block diagram bias circuit configuration according to the present invention. Junction 28 of IC 22 has been coupled to bias generating circuit 12 as is the bias pin for IC 10. AC signal coupling capacitors 32 and 34 are no longer required and filter capacitor 30 is eliminated as being redundant with capacitor 18. Resistors 36 and 38 substitute for resistor 40 of FIG. 1 to couple the bias voltage from bias generating circuit 12 to IC 10 with little or no voltage drop while providing AC isolation so as not to short the AC signal to ground through capacitor 18.

Thus, all of the exemplary IC's operate at the same Vcc/2 bias supply by coupling the bias/filter points of the discrete IC's together. This allows the effected stages to be DC coupled and individual bias bypass capacitors eliminated. Additionally, since the fractional Vcc bias supply acts as an AC signal ground, ground modulation problems between the various IC's is reduced or eliminated. It should be noted that it may be desirable that the common bias generating circuit 12 have a sufficiently low impedance to "swamp out" the generally higher impedance bias generating circuits internal to the IC's.

It should be noted that this approach would also work for other fractional bias points with respect to Vcc or ground, e.g., Vcc/3, if appropriate. It should further be noted for some of the commonly bias coupled IC's, that the bias voltage will not be at exactly the correct fraction of Vcc with respect to ground and there may be a slight reduction of dynamic range for the individual IC.

In the exemplary embodiment amplifiers 40 and 42 are LM 324 IC's and, if appropriate, also have their bias circuitry (not shown) common with the other IC's (not shown).

What is claimed is:

1. Apparatus comprising:

a first circuit;

a first bias voltage source for deriving a first bias voltage for at least a portion of said first circuit; said first bias voltage being available at a first terminal;

said first circuit and said said first bias voltage source being incorporated within an integrated circuit; said first terminal being a terminal of said integrated circuit;

a second circuit separate from said integrated circuit;

a second bias voltage source for deriving a second bias voltage for at least a portion of said second circuit; said second bias voltage available at a second terminal; and means DC coupling said first terminal of said first bias source to said second terminal of said second bias source for equalizing said first and second bias voltages.

2. The apparatus recited in claim 1, further including:

means for coupling a signal between said portion of said first circuit and said portion of said second circuit without DC isolation.

3. The apparatus recited in claim 1, wherein:

said first and second bias sources share a single filter circuit.

4. The apparatus recited in claim 1, wherein:

said first and second bias voltages are at least approximately equal even in the absence of said means DC coupling said first terminal of said first bias source to said second terminal of said second bias source.

5. The apparatus recited in claim 1, wherein:

said first and second bias voltage sources derive said first and second bias voltages from the same supply voltage.

6. The apparatus recited in claim 5, wherein:

said first and second bias voltages are approximately equal to one-half of said supply voltage even in the absence of said means DC coupling said first terminal of said first bias source to said second terminal of said second bias source.

7. Apparatus comprising:

a first circuit a first bias voltage source for deriving a first bias voltage for at least a portion of said first circuit; said first bias voltage being available at a first terminal;

said first circuit and said said first bias voltage source being incorporated within an integrated circuit; said first terminal being a terminal of said integrated circuit;

a second circuit separate from said integrated circuit;

a second bias voltage source for deriving a second bias voltage for at least a portion of said second circuit; said second bias voltage available at a second terminal;

means DC coupling said first terminal of said first bias source to said second terminal of said second bias source for equalizing said first and second bias voltages; and means for coupling a signal between said portion of said first circuit and said portion of said second circuit without DC isolation.

* * * * *